United States Patent [19]

Sanderson

[11] Patent Number: 4,760,238

[45] Date of Patent: Jul. 26, 1988

[54] CHARGED PARTICLE BEAM GENERATION

[75] Inventor: Allan Sanderson, Duxford, England

[73] Assignee: The Welding Institute, Cambridge, England

[21] Appl. No.: 4,972

[22] Filed: Jan. 20, 1987

[30] Foreign Application Priority Data

Jan. 21, 1986 [GB] United Kingdom ............... 8601421

[51] Int. Cl.⁴ .............................................. B23K 15/00
[52] U.S. Cl. ......................... 219/121.27; 219/121.13; 219/121.25
[58] Field of Search .............. 219/121 ET; 250/356, 250/358 R; 313/305

[56] References Cited

U.S. PATENT DOCUMENTS 3,381,157  4/1968  Ferreira ..................... 219/121 ET
3,466,487  9/1969  Davis et al. ................ 219/121 ET
4,325,084  4/1982  Van Gorkom et al. ........ 313/503 X
4,498,952  2/1985  Christensen .................. 313/309 X

FOREIGN PATENT DOCUMENTS 0207539  11/1984  Japan .............................. 313/309

Primary Examiner—C. L. Albritton
Attorney, Agent, or Firm—Martin M. Novack

[57] ABSTRACT

A charge particle beam generator is described which comprises an annular arrangement of filaments (6) which, when heated, emit electrons. A microprocessor controller (not shown) causes a voltage to be applied across each filament (6) in succession so as to cause the filament to generate electrons. An annular anode (9) is provided radially inwardly of the filaments (6) to accelerated electrons away from the filaments in the form of a beam towards a joint between a pair of workpieces to be welded.

20 Claims, 3 Drawing Sheets

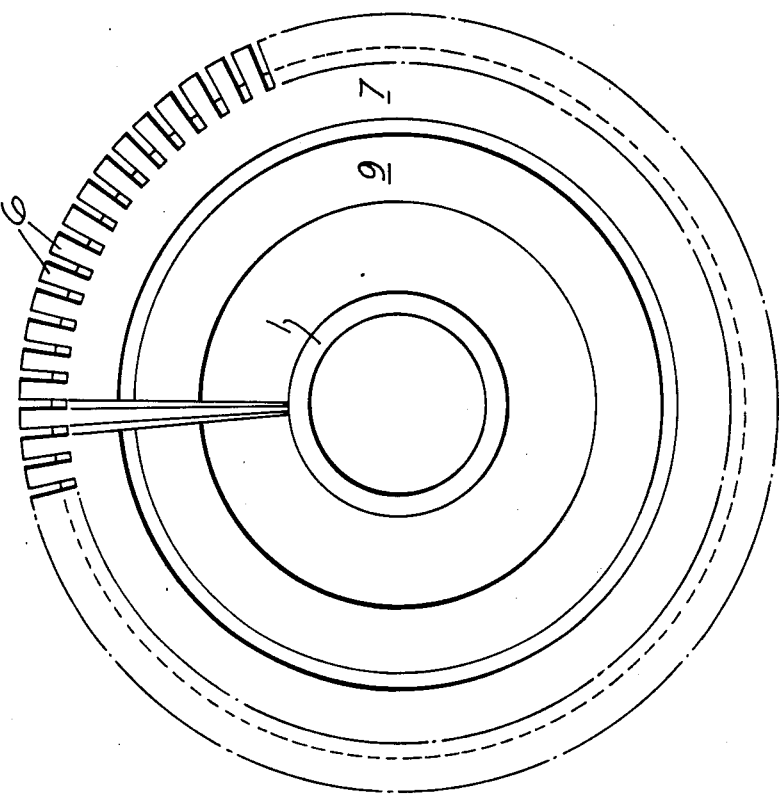
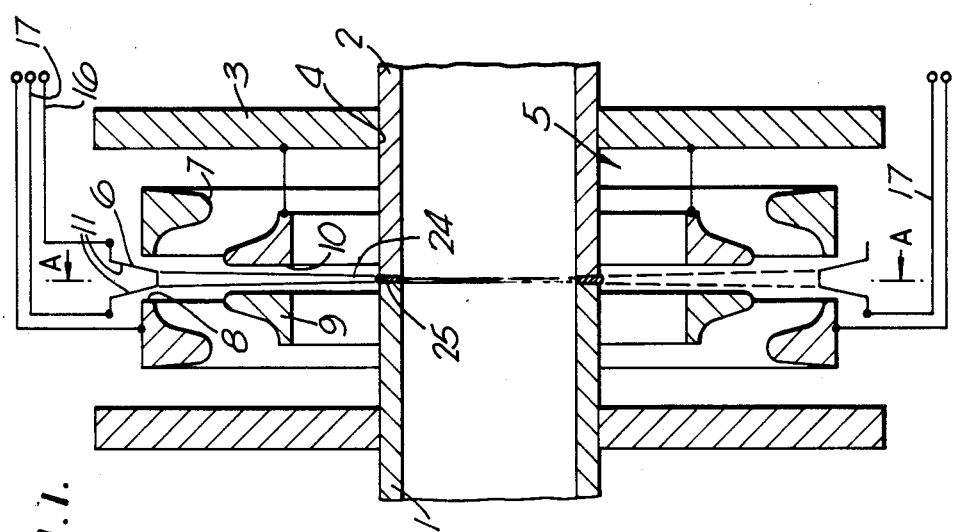

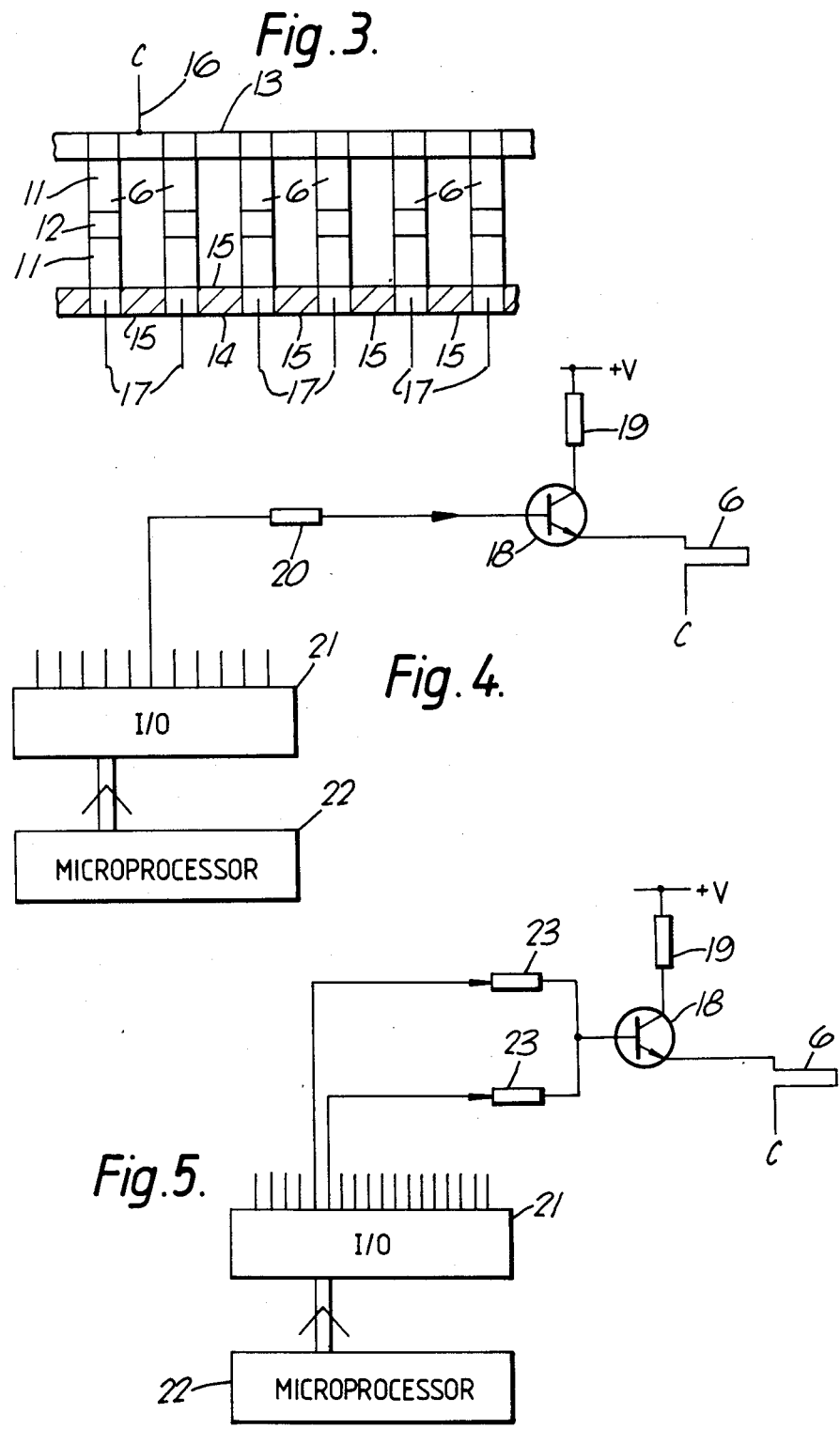

CHARGED PARTICLE BEAM GENERATION

FIELD OF THE INVENTION

The invention relates to methods and apparatus for generating a beam of charged particles for the purposes of material processing in defined paths.

DESCRIPTION OF THE PRIOR ART

Charged particle beams such as electron beams find particular application in the conditioning of metals and other materials by for examle heating, brazing, heat treating and surface hardening as well as the cutting and welding of workpieces.

A major problem exists in the welding of tube or pipe. External circumferential butt welding of tube and pipe in situ where neither tubular component can be rotated is at present almost entirely carried out by arc or plasma welding in which welding proceeds by translation by orbital motion of a welding torch or head around the components to be joined. For thin wall tube the process may only require one pass, but usually requires the addition of filler. In the case of arc and even plasma welding the transfer of heat into the liquid metal weld pool is almost entirely by conduction through the liquid which leads to considerable heat spread and a relatively large weld pool. Since penetration in the liquid pool is limited, it is customary to provide a "V" preparation and welding proceeds by the laying down of numerous overlapping passes.

Orbital tube welding can also be effected by propelling an arc struck between the tubular components around the tube periphery by means of a radial magnetic field (e.g by MIAB welding) but the weld quality in this case is generally not very good and it is particularly difficult to avoid ragged protruding weldbeads on the inside and outside surfaces. This method also requires the tube to be separated and then forcibly brought together to produce a forge weld.

In the case of all arc welding processes it is necessary to provide a gas in which the arc is struck. For welding in situations where the environment gas pressure is not close to one atmosphere this would necessitate the supply and containment of a gas at approximately one atmosphere to allow an arc to be struck and sustained.

Stationary tubes and pipes may also be joined by processes such as radial friction welding in which a consumable collar is rotated in contact with a previously prepared "V" preparation. The process, however, necessitates substantial mechanical forces and a very high peak power input. Also the equipment by its nature tends to be relatively bulky and heavy.

Circumferential butt joining of static tubular parts can also be achieved by means of hot pressure or diffusion bonding but again this generally requires a very high power input which must be maintained for extended periods (eg. ½hr-5 hrs). In addition there are currently substantial difficulties in verifying the integrity of such solid phase bonds; an NDT (non-destructive testing) technique has yet to be devised which will differentiate between a satisfactory bond and parts which have merely been pressed into very initimate contact whilst achieving only a partial metallurigcal bond.

Alternatively tubular welding can be achieved by explosive welding but this involves lapping one part over the other and may not be acceptable for certain applications where detonation of explosives could cause damage to connecting or nearby components of pipework systems.

One other possible method of effecting a tubular weld consists of orbiting a laser beam head or laser beam in conjunction with a system of mirrors around the components to be joined. Unfortunately lasers tend to be rather cumbersome and delicate devices, with relatively limited capability of penetrating metals. In addition they are very inefficient in conversion of electrical power into light and a large proportion of the laser beam power is lost by reflection from the workpiece surface. Also no simple means has yet been found to orbit a powerful beam of light around a static long tubular object to accomplish a circumferential butt weld.

In the case of annular glow discharge welding it is possible to produce an annular sheet of electrons which can produce a "single shot" weld between two abutting tubular components but the peak power demand is very high and the power density in the beam and the weld penetration mechanism is generally unsuitable for producing anything other than a conduction weld. Therefore penetration of metals is limited while the total energy requirements per weld are very high. In addition it is necessary to provide a gaseous atmosphere to allow formation of a suitable glow discharge in order to generate the annular electron beam from a cold cathode. Furthermore present available glow discharge devices are limited in power.

Other more conventional electron beam systems have been devised for tube and pipe welding but these rely on the translation of an electron gun or gun column in orbital fashion around the components to be welded. Consequently, the equipment tends to be cumbersome and requires considerable radial clearance. The need to provide a rotation mechanism is a further complication and by definition involves moving parts and a motor drive system. This applies also to the converse system where the tubular pipe is rotated in front of a fixed electron beam generator.

Similar problems arise in the cutting of curved workpieces as well as in local hardening, heating and deposition applications.

SUMMARY OF THE INVENTION

In accordance with one aspect of the present invention, a method of generating a beam of charged particles comprises causing charged particles to be emitted successively from a series of regions along an elongate or ring like particle generating assembly; and accelerating the particles away from the generating assembly in the form of a beam whereby beams of charged particles are generated successively from the regions along the assembly.

Instead of attempting to make use of a conventional charged particle beam source, we have modified the form of the source itself. This considerably simplifies the problems encountered when it is desired to expose a curved surface to a moving beam of charged particles.

Preferably, the particle generating assembly includes a heat responsive emitter, the step of causing the particle generating assembly to emit charged particles comprising successively heating positions along the emitter. This may be achieved by successively exposing the positions to an auxiliary charged particle beam to cause local heating. The auxiliary beam may be an electron beam and may be guided to the member by methods and apparatus described in our copending U.S. Patent Application of even date entitled "Controlling Charged Particle Beams".

Preferably, the method comprises successively heating groups of positions along the emitter. Conveniently the groups overlap.

In accordance with a second aspect of the present invention, a charged particle beam generator for use in an evacuated atmosphere comprises an elongate or ring like particle generating assembly; activating means for causing charged particles to be emitted successively from a series of regions along the particle generating assembly; and accelerating means for accelerating the particles away from the particle generating assembly in the form of a beam whereby beams of charged particles are generated successively from the regions along the assembly.

The particle generating assembly may be curved and is preferably annular for mounting around tubular or bar components and the like. In other arrangements, the particle generating assembly may be linear.

The particle generating assembly may comprise an emitter member and an adjacent emission control member and either or both of these members may be continuous or comprise a plurality of individual subsidiary members positioned side by side. For example, the emitter member may comprise a number of heat responsive elements such as hot filaments or cathodes which emit charged particles on being heated. In another arrangement, the emitter member may comprise a cold source responsive to ion bombardment to emit charged particles (similar to glow discharge methods).

In the case of an emitter member responsive to heating to generate charged particles, this may be achieved in a variety of ways by for example resistive, inductive, or RF heating or by more indirect means such as by an auxiliary electron beam source as mentioned above.

Where a continuous heat responsive emitter member is provided, this may be continuously heated and in this case, the generation of successive beams of charged particles will be under the control of the emission control member. This control member could comprise an emitter shield or grid cup which in the case of a continuous emitter member is preferably segmented so that individual segments or groups of segments can be swtiched on and off in series.

In other arrangements, both the emitter member and the emission control member could be formed from a plurality of subsidiary members forming individual gun segments. These could then be switched on and off by applying suitable accelerating voltages.

In the case of a diode gun the cathode shield would be maintained at the same potential as the emitter, whereas for a triode the grid cup would be biased i.e. 0 to −3000 V with respect to the emitter.

It will be appreciated that the invention is particularly suitable for the generation of electron beams but other charged particle beams such as ion beams could also be generated. In the preferred arrangement the particle generating assembly comprises a plurality of individual filaments, these may be heated by any of the means just described or by connecting individual filaments in respective heating circuits which are successively energised. For example, all the filaments could be connected in series with controllable semiconductor elements in parallel, such that only one or a limited group of elements are heated at any one time. In effect, all the filaments except a few are shorted or shunted by semi-conductors, such as transistors, so that heating of only a small group occurs.

The accelerating means may comprise, particularly where the particle generating assembly includes a cathode or cathodes, of an elongate or ring like anode positioned adjacent to but spaced from the particle generating assembly, the anode or anodes including a slot or slots through which the particles are accelerated in the form of the beam.

In use, an evacuated atmosphere (vacuum) may be provided by sealing the apparatus in a conventional manner. If the apparatus is to be used in space, however, the pressure should be sufficiently low.

BRIEF DESCRIPTION OF THE DRAWINGS

An example of a method and apparatus in accordance with the present invention will now be described with reference to the accompanying drawings, in which:

FIG. 1 is a cross-section through the apparatus;

FIG. 2 is a section taken along the line A—A;

FIG. 3 is a partial plan of the filament assembly,

FIGS. 4 and 5 illustrate two types of filament control circuit; and,

DETAILED DESCRIPTION OF AN EMBODIMENT

Figure 6:
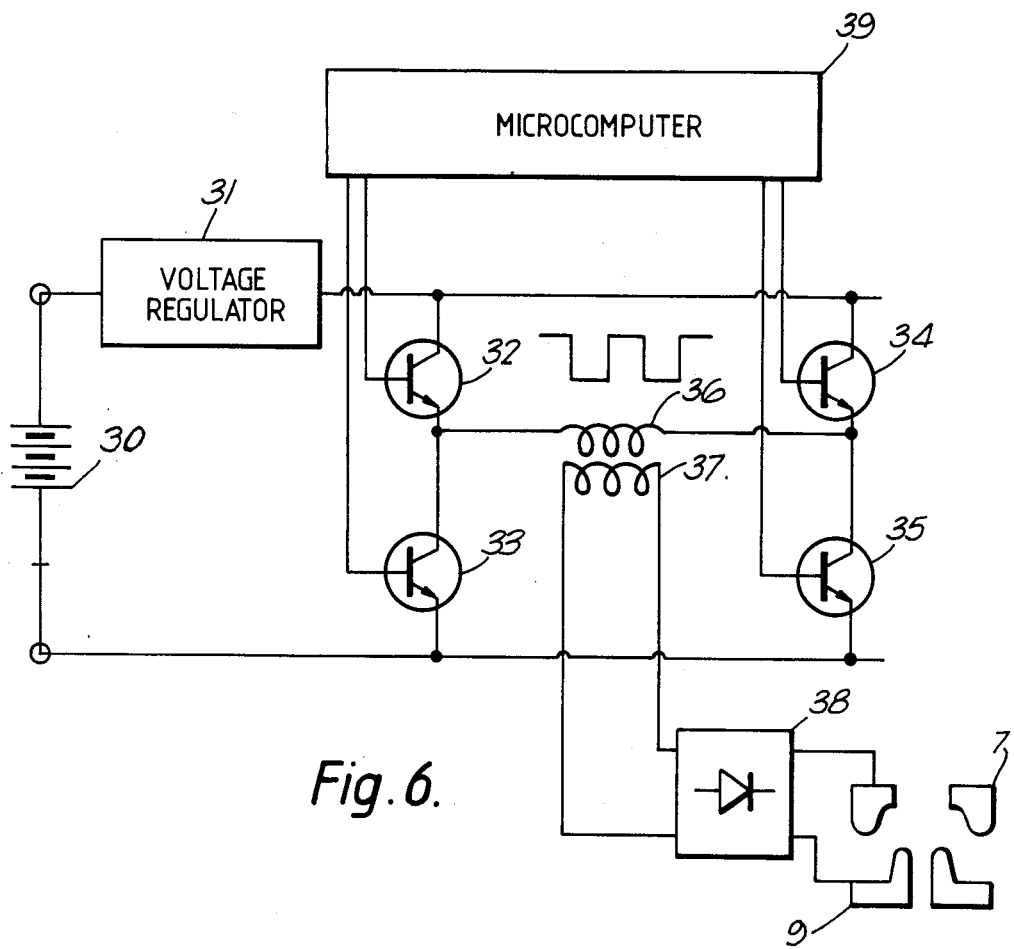
FIG. 6 is a circuit diagram illustrating part of the electron beam control source.

The apparatus shown in the drawings is for electron beam welding a pair of tubes 1, 2. The apparatus is illustrated diagrammatically in the drawings and comprises an annular housing 3 having a bore 4 into which the tubes 1, 2 are fitted. The housing 3 is sealed to the tubes 1, 2 and defines a sealed region 5. For simplicity, the means for sealing the region 5 have been omitted. Within the region 5 is mounted an annular electron generating assembly comprising a large number of filaments 6 arranged in an annular configuration coaxial with the axis of the tubes 1, 2. These filaments 6 form individual cathodes and are positioned within an annular grid cup or cathode shield 7. The shield 7 has an annular slot 8 through which the filaments 6 protrude. The cathod shield 7 and the filaments 6 are maintained at a high voltage (negative with respect to the tubes 1, 2 and the anode 9).

An annular anode 9 coaxial with the axis of the tubes 1, 2 is mounted radially inwardly of the filaments 6 and has an annular slot 10 in alignment with the filaments and cathode shield.

The anode 9 and cathode shield 7 are connected in an acceleration circuit (FIG. 6) in a conventional manner. The control circuit shown in FIG. 6 comprises a dc source 30 connected to a voltage regulator 31. This is to deal with the problems of a potentially large load on the supply 30 which might be unacceptable in space applications where the supply 30 is the main supply to other equipment in a space station. Two transistor pairs 32, 33; 34,35 are connected in parallel with the supply 10 and a primary coil 36 is connected between the collectors of transistors 33, 35. A secondary coil 37 is connected via a high voltage rectifier 38 across the cathode 7 and anode 9 of the electron gun. A microcomputer 39 of a conventional form is programmed to switch on and off alternately the transistor pairs 32, 35 and 34, 33. This causes a continuous current to flow in the circuit containing the secondary coil 37, the cathode 7 and the anode 9.

Each filament 6 is connected in a respective heating circuit to be described and the degree of heating due to each filament 6 can be individually controlled.

Each filament 6 has a V-shape with a pair of legs 11 connected together by a lateral section 12. (FIG. 3) The radially outer end of each leg 11 of the filaments 6 is connected respectively to a common, annular conductor 13 and an annular support 14. The annular support 14 has insulating regions 15 which separate the filaments 11 while the common conductor 13 is connected to the filament common rail connection via a conductor 16. Each leg 11 of the filaments 6 supported by the support 14 is connected via a respective conductor 17 to a control circuit.

One example of a control circuit is shown in FIG. 4. In this example, the filament 6 is connected to the emitter of an npn transistor 18 whose collector is connected via a resistance 19 to a positive potential +V. The gate of the transistor 18 is connected via a resistor and optical isolator 20 to one port of an interface circuit 21 coupled with a controlling microprocessor 22. Each transistor 18 has a gate coupled with a respective port of the circuit 21.

An alternative filament control circuit is shown in FIG. 5. In this case, the potential applied across each filament 6 is controlled via the transistor 18 by a two bit control signal (as opposed to the one bit control signal used in FIG. 4). Thus, the gate of each transistor 18 is connected in common to a pair of parallel resistors and optical isolating elements 23 each of which is connected to the interface circuit 21.

In the simplest form of operation, the control circuit of FIG. 4 is utilised and the microprocessor 22 addresses each output port of the interface circuit 21 in turn. Thus, when an output port is selected, a relatively high voltage is applied via the resistor and optical isolator 20 to the gate of the transistor 18 switching the transistor on. This causes a sufficient current to pass through the filament 6 so that electrons will be thermally emitted from the filament and due to the proximity of the anode 9 these electrons will be accelerated towards the tubes 1, 2 in the form of a beam 24. Additional focussing means (not shown) may be provided to assist beam formation and to focus the beam onto a junction 25 between the tubes 1, 2. The beam 24 will cause the material of the tubes 1, 2 adjacent the joint 25 to heat up.

After a predetermined time set by the microprocessor 22, the voltage applied to the gate of the transistor 18 will be reduced thus switching off the transistor and a similar voltage will be applied to the transistor 18 of the next successive filament 6 which will be heated in an exactly similar manner and create another radial electron beam which will heat a region of the joint 25 adjacent to the first region. As the previously heated region cools, a weld will be formed.

It will be seen therefore that each filament 6 generates an essentially radial beam focussed in the vicinity of the tube surface at respective positions and the control circuits effectively cause a radial beam to translate around the joint 25.

In general, the microprocessor 22 will not be operated in a simple manner by switching off a filament as soon as the next filament is switched on. In one arrangement, a number of the filaments 6 may be switched on at any one time so as to generate a composite radial beam formed form a number of subsidiary beams, one for each filament. This composite beam is then translated around the joint 25 by switching on the next successive filament 6 and switching off the trailing filament 6 but with the remianing intermediate filaments unchanged (still switched on). This enables welding to occur in a more progressive manner.

A further enhancement can be obtained by using the control circuit of FIG. 5. In this enhancement, current flowing through the filament 6 can be controlled to take up an intermediate value between zero (transistor 18 switched off) and a maximum current (transistor 18 fully switched on). This is achieved by causing the microprocessor 22 to generate a two bit control signal for each filament 6. The current corresponding to a binary 1 is then chosen to cause the transistor 18 partially to switch on. For example, typically strong emission from the filament 6 will occur at a temperature of about 2900 K and 50% emission at a temperature of about 2800 K. Thus, by suitably controlling the voltage applied across the filament 6 each filament can be controlled to emit at maximum power, 50% power, or 0% power. This enables the filament 6 to be "faded in" and "faded out" in sequence and results in a more continuous welding technique. In all these methods, weld overlap may be achieved by continuing the process beyond 360° rotation.

I claim:

1. A method of generating a beam of charged particles, the method comprising causing charged particles to be emitted successively from a series of regions along an elongate particle generating assembly; and accelerating said particles away from said generating assembly in the form of a beam whereby beams of charged particles are generated successively from said regions along said assembly.

2. A method according to claim 1, wherein said particle generating assembly includes a heat responsive emitter defining a plurality of positions, said step of causing said particle generating assembly to emit charged particles comprising successively heating said positions along said emitter.

3. A method according to claim 2, further comprising successively heating groups of said positions along the emitter.

4. A method according to claim 3, wherein said groups of positions overlap.

5. A method according to claim 3, wherein each said group of positions defines leading and trailing positions which are heated to a level less than said positions between said leading and trailing positions.

6. A charged particle beam generator for use in an evacuated atmosphere, the generator comprising an elongate particle generating assembly; activating means for causing charged particles to be emitted successively from a series of regions along said particle generating assembly; and accelerating means for accelerating said particles away from said particle generating assembly in the form of a beam whereby beams of charged particles are generated successively from said regions along said assembly.

7. A generator according to claim 5, wherein said particle generating assembly is annular.

8. A generator according to claim 6, wherein said emitter member comprises a number of heat responsive elements.

9. A generator according to claim 8, wherein said activating means comprises a common controller, and a number of control means, one for each said element, each said control means being connected to said common controller which controls activation of said elements.

10. A generator according to claim 6, wherein said particle generating assembly generates an electron beam.

11. A method of generating a beam of charged particles, the method comprising causing charged particles to be emitted successively from a series of regions along a ring like particle generating assembly; and accelerating said particles away from said generating assembly in the form of a beam whereby beams of charged particles are generated successively from said regions along said assembly.

12. A method according to claim 11, wherein said particle generating assembly includes a heat responsive emitter defining a plurality of positions, said step of causing said particle generating assembly to emit charged particles comprising successively heating said positions along said emitter.

13. A method according to claim 12, further comprising successively heating groups of said positions along the emitter.

14. A method according to claim 13, wherein said groups of positions overlap.

15. A method according to claim 13, wherein each said group of postioins defines leading and trailing positions which are heated to a level less than said positions between said leading and trailing positions.

16. A charged particle beam generator for use in an evacuated atmosphere, the generator comprising a ring like particle generating assembly; activating means for causing charged particles to be emitted successively from a series of regions along said particle generating assembly; and accelerating means for accelerating said particles away from siad particle generating assembly in the form of a beam whereby beams of charged particles are generated successively from said regions along said assembly.

17. A generator according to claim 16, wherein said particle generating assembly is annular.

18. A generator according to claim 16, wherein said emitter member comprises a number of heat responsive elements.

19. A generator according to claim 18, wherein said activating means comprises a common controller, and a number of control means, one for each said element, each said control means being connected to said common controller which controls activation of said elements.

20. A generator according to claim 16, wehrein said particle generating assembly generates an electron beam.

* * * * *